(12) United States Patent
Kamei et al.

(10) Patent No.: US 10,159,153 B2
(45) Date of Patent: Dec. 18, 2018

(54) ENTRY SHEET FOR DRILLING

(71) Applicant: Mitsubishi Gas Chemical Company, Inc., Tokyo (JP)

(72) Inventors: Takayuki Kamei, Yamagata (JP); Yousuke Matsuyama, Yamagata (JP); Takuya Hasaki, Yamagata (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 14/389,170

(22) PCT Filed: Mar. 22, 2013

(86) PCT No.: PCT/JP2013/058376
§ 371 (c)(1),
(2) Date: Sep. 29, 2014

(87) PCT Pub. No.: WO2013/146612
PCT Pub. Date: Oct. 3, 2013

(65) Prior Publication Data
US 2015/0072122 A1 Mar. 12, 2015

(30) Foreign Application Priority Data
Mar. 27, 2012 (JP) .................................. 2012-071081

(51) Int. Cl.
*H05K 3/00* (2006.01)
*B26F 1/16* (2006.01)
(Continued)

(52) U.S. Cl.
CPC ........... *H05K 3/0047* (2013.01); *B23B 41/14* (2013.01); *B23B 47/00* (2013.01); *B26D 7/088* (2013.01);
(Continued)

(58) Field of Classification Search
CPC ......... B32B 27/08; B32B 27/32; B32B 15/08; B23B 2250/12; B26D 7/088; H05K 2203/127; H05K 2203/0214; H05K 3/0047
(Continued)

(56) References Cited

U.S. PATENT DOCUMENTS 3,608,054 A 9/1971 Alvino
4,195,550 A 4/1980 Witt et al.
(Continued)

FOREIGN PATENT DOCUMENTS

CN 101081389 A 12/2007
CN 103554844 A 2/2014
(Continued)

OTHER PUBLICATIONS

Molysulfidea Product Data Sheet, Climax Molybdenum, 2015.*
(Continued)

*Primary Examiner* — Frank J Vineis
*Assistant Examiner* — Alicia J Sawdon
(74) *Attorney, Agent, or Firm* — Fitch, Even, Tabin & Flannery LLP

(57) ABSTRACT

The present invention provides an entry sheet for drilling excellent in hole position accuracy compared with the conventional entry sheet for drilling. Such an entry sheet for drilling is an entry sheet for drilling comprising metallic support foil and a layer comprising a resin composition formed on at least one surface of the metallic support foil, in which the resin composition contains a resin and 70 parts by mass to 130 parts by mass of molybdenum disulfide based on 100 parts by mass of the resin, and the layer comprising the resin composition has a thickness in a range from 0.02 to 0.3 mm.

18 Claims, 6 Drawing Sheets

(51) Int. Cl.
  *B26D 7/08* (2006.01)
  *B23B 41/14* (2006.01)
  *B23B 47/00* (2006.01)

(52) U.S. Cl.
  CPC ............ *B26F 1/16* (2013.01); *B23B 2224/16* (2013.01); *B23B 2250/12* (2013.01); *H05K 2203/0214* (2013.01); *H05K 2203/127* (2013.01); *Y10T 428/24967* (2015.01); *Y10T 428/256* (2015.01); *Y10T 428/269* (2015.01)

(58) Field of Classification Search
  USPC ......................................................... 428/215
  See application file for complete search history.

(56) References Cited

U.S. PATENT DOCUMENTS

| | | | |
|---|---|---|---|
| 4,243,434 A * | 1/1981 | Hartley et al. | 148/246 |
| 4,329,238 A * | 5/1982 | Mitrofanova et al. | 508/124 |
| 4,772,496 A * | 9/1988 | Maeda et al. | 428/35.9 |
| 5,082,402 A | 1/1992 | Gaku et al. | |
| 5,173,204 A * | 12/1992 | Chiddick | C10M 111/04 |
| | | | 508/154 |
| 5,427,698 A * | 6/1995 | Hirokawa et al. | 508/106 |
| 5,435,671 A * | 7/1995 | Weinreich | H05K 3/0047 |
| | | | 408/1 R |
| 5,985,080 A * | 11/1999 | Kobayashi et al. | 156/244.24 |
| 2002/0003991 A1 | 1/2002 | Ohashi et al. | |
| 2003/0100456 A1* | 5/2003 | Hasaki et al. | 508/517 |
| 2004/0209091 A1 | 10/2004 | Izumi et al. | |
| 2005/0003169 A1* | 1/2005 | Ikeguchi | B23B 35/00 |
| | | | 428/195.1 |
| 2007/0231562 A1* | 10/2007 | Hsiao | B23B 47/00 |
| | | | 428/323 |
| 2007/0281181 A1 | 12/2007 | Akita et al. | |
| 2008/0100291 A1 | 5/2008 | Mayder | |
| 2008/0292860 A1 | 11/2008 | Yagishita | |
| 2010/0167041 A1 | 7/2010 | Matsuyama et al. | |
| 2010/0230382 A1 | 9/2010 | Narahashi et al. | |
| 2011/0285124 A1* | 11/2011 | Pinel | C10M 105/34 |
| | | | 285/94 |
| 2012/0024586 A1 | 2/2012 | Yoshimura et al. | |
| 2015/0072122 A1 | 3/2015 | Kamei et al. | |
| 2016/0045961 A1 | 2/2016 | Umehara et al. | |
| 2016/0264745 A1 | 9/2016 | Du et al. | |

FOREIGN PATENT DOCUMENTS

| | | | | |
|---|---|---|---|---|
| DE | 102010031130 A1 | 1/2012 | | |
| EP | 0 687 715 | * 10/2001 | | C09D 5/08 |
| EP | 1174006 B1 | 8/2004 | | |
| JP | S63-277298 A | 11/1988 | | |
| JP | H04-92494 | 3/1992 | | |
| JP | H04-92494 A | 3/1992 | | |
| JP | H05-169400 | 7/1993 | | |
| JP | H05-169400 A | 7/1993 | | |
| JP | H06-17847 U | 3/1994 | | |
| JP | H08-281508 A | 10/1996 | | |
| JP | 2000-61896 A | 2/2000 | | |
| JP | 2000-334697 A | 12/2000 | | |
| JP | 3251082 B2 | 11/2001 | | |
| JP | 2002-210608 A | 7/2002 | | |
| JP | 2002-292599 A | 10/2002 | | |
| JP | 2003-94217 A | 4/2003 | | |
| JP | 2003-94389 A | 4/2003 | | |
| JP | 2003-136485 A | 5/2003 | | |
| JP | 2003-175412 A | 6/2003 | | |
| JP | 2003-225814 A | 8/2003 | | |
| JP | 2003-301187 A | 10/2003 | | |
| JP | 2004-230470 B2 | 8/2004 | | |
| JP | 2009-172755 A | 8/2004 | | |
| JP | 2004-338271 A | 12/2004 | | |
| JP | 2005081508 A | 3/2005 | | |
| JP | 2006-150557 A | 6/2006 | | |
| JP | 3134127 U | 7/2007 | | |
| JP | 3134127 U | 8/2007 | | |
| JP | 3134128 U | 8/2007 | | |
| JP | 2007-281404 A | 10/2007 | | |
| JP | 2008-183626 A | 8/2008 | | |
| JP | 2008-222762 A | 9/2008 | | |
| JP | 2009-18385 A | 1/2009 | | |
| JP | 2009-39810 A | 2/2009 | | |
| JP | 3153156 U | 8/2009 | | |
| JP | 2009-241239 A | 10/2009 | | |
| JP | 2003-26945 A | 12/2009 | | |
| JP | 2010-179379 A | 8/2010 | | |
| JP | 2010-540260 A | 12/2010 | | |
| JP | 2011-56583 A | 3/2011 | | |
| JP | 4782222 B2 | 7/2011 | | |
| JP | 4798308 B2 | 8/2011 | | |
| JP | 2012-210689 A | 11/2012 | | |
| JP | 2012-223882 A | 11/2012 | | |
| TW | 201043362 A | 12/2010 | | |
| TW | 201100588 A | 1/2011 | | |
| WO | 2009/045932 A1 | 4/2009 | | |
| WO | 2009/151107 A1 | 12/2009 | | |
| WO | 2010/140333 A1 | 12/2010 | | |
| WO | 2011/158510 A1 | 12/2011 | | |
| WO | 2012/091179 A1 | 7/2012 | | |
| WO | 2013/146612 A1 | 10/2013 | | |

OTHER PUBLICATIONS

Material Safety Data Sheet Molybdenum(iv) sulfide; created Sep. 9, 1998.*
Garcia et al. (Waste Management 29(6), 1814-1818 (Year: 2009)).*
International Search Report dated Jun. 18, 2013 for PCT/JP2013/058376 and English translation of the same (2pages).
"Function & Application of Water Soluble Polymer" written by Teruo Horiuchi in Japanese.
CP Kelco, Carboxymethylcellulose Book, 2009, pp. 1-26.

* cited by examiner

ENTRY SHEET FOR DRILLING

CROSS-REFERENCE TO RELATED APPLICATIONS

This application is a U.S. national phase application filed under 35 U.S.C. § 371 of International Application PCT/JP2013/058376, filed on Mar. 22, 2013, designating the United States, which claims priority from Japanese Application Number 2012-071081, filed Mar. 27, 2012, which are hereby incorporated herein by reference in their entirety.

TECHNICAL FIELD

The present invention relates to an entry sheet for drilling.

BACKGROUND ART

As a method for drilling processing of a laminated board or a multi-layer board that is used in a printed wiring board material, a method involving conducting hole boring processing by placing, as an entry board, metal foil of aluminum or the like used alone or a sheet obtained by forming a resin composition layer on a surface of the metal foil (hereinafter, the sheet is usually referred to as "entry sheet for drilling", or also simply referred to as "entry sheet") on the top of one laminated board or multi-layer board or a plurality of laminated boards or multi-layer boards piled has generally been adopted. Although commonly a "copper clad laminated board" is often used as the laminated board, the laminated board may be a "laminated board" that does not have a copper foil on an outer layer.

In recent years, the progress of high densification, improvements in productivity, reduction in cost, and improvements in reliability have been demanded for the laminated board or the multi-layer board that is a printed wiring board material, and high quality hole boring processing such as improvements in hole position accuracy has been required. In order to meet these demands, a processing method for hole boring using a sheet comprising a water-soluble resin such as a polyethylene glycol (see, for example, Japanese Patent Application Laid-Open No. 4-92494) has been proposed. Moreover, a lubricant sheet for hole boring obtained by forming a water-soluble resin layer on metal foil has been proposed (see, for example, Japanese Patent Application Laid-Open No. 5-169400). Furthermore, an entry sheet for hole boring obtained by forming a water-soluble resin layer on aluminum foil on which a thin film of a thermosetting resin is formed has been proposed (see, for example, Japanese Patent Application Laid-Open No. 2003-136485).

Moreover, an auxiliary material having a three layered-structure comprising a lubricating layer/ a composite material layer/ a support material, in which auxiliary material nano-structured powder is blended in a composite material layer, has been proposed (see, for example, Japanese Patent Application Laid-Open No. 2007-281404 and Japanese Utility Model Registration No. 3134128), and molybdenum disulfide has been referred as the nano-structured powder.

SUMMARY OF INVENTION

However, the progress of the printed wiring board technology is slower than the progress of the semiconductor technology, and there is a gap between the progress of the semiconductor technology and the progress of the printed wiring board technology. Therefore, the demands for the high densification and improvements in reliability of the printed wiring board are increasingly becoming high. For example, the minimum drill bit diameter in mass production is shifting from 0.2 mmϕ, through 0.18 mmϕ and 0.15 mmϕ, to 0.105 mmϕ. Moreover, drilling of 0.08 mmϕ, 0.075 mmϕ, and 0.05 mmϕ in only a small part of studies has been tried in rivalry with laser hole boring technology. Furthermore, there is also no limit to the demands for improvements in productivity and reduction in cost due to the competition caused by globalization and the accommodation of demands in developing countries. Now, the development of a novel entry sheet for drilling to meet these demands has therefore been earnestly desired.

However, the techniques proposed in Japanese Patent Application Laid-Open No. 4-92494, No. 5-169400 and No. 2003-136485 have not reached the level that sufficiently meets the above-described requests. Moreover, with respect to the techniques proposed in Japanese Patent Application Laid-Open No. 2007-281404 and Japanese Utility Model Registration No. 3134128, it is not clear how the nano-structured powder acts on the lubricating property, the wear resistance of the drill bit, or the like, and the involvement of the nano-structured material with the hole position accuracy has not been made clear. Thus, the development of an entry sheet for drilling excellent in hole position accuracy has been requested. It is expected that such an entry sheet for drilling contributes to high densification, high reliability, improvements in productivity, and reduction in cost.

The present invention intends to provide, in consideration of the present situation, an entry sheet for drilling that is excellent in hole position accuracy compared with the conventional entry sheet for drilling.

The present inventors have made various studies for the purpose of solving the problems and blended molybdenum disulfide as a solid lubricant in a resin composition to be used for an entry sheet for drilling and optimize the amount thereof to be blended in a particular range. It has been found that, as a result, the drill bit easily bites the entry sheet to improve the centrality of a drill hit and thereby the hole position accuracy is improved. Furthermore, it has been found that the lubricating property of the entry sheet is improved and the discharge of chips becomes smooth due to the solid lubricating action of molybdenum disulfide. It has been found that chips are thereby prevented from becoming a lump (block) and dropping and the problem of drill bit breakage caused by the chips in a lump state being put between the tip of the drill bit and the bottom of a hole that is being formed during hole boring (machining) can be prevented.

In the present description, the "centrality" denotes the straight advancing property in the machining direction during machining. For example, a cutting blade at the tip of a rotating drill bit bites the surface of the resin composition layer while sliding and moving at a point where the drill bit contacts a layer comprising a resin composition, the layer provided in the entry sheet for drilling (hereinafter, referred to as "resin composition layer"). At this time, with an entry sheet in which the lubricating property is just made high, the centrality is impaired because the cutting blade at the tip of the drill bit becomes liable to sideslip to deteriorate the hole position accuracy. In addition, the "centripetal force" in the present description means external stress to improve the centrality of the drill bit. Examples of the centripetal force include stress applied against the rotation center when the drill bit rotates.

The present invention has been made based on the above-described findings, and the gist of the present invention is as follows.

(1) An entry sheet for drilling comprising metallic support foil and a layer formed on at least one surface of the metallic support foil and comprising a resin composition, wherein the resin composition contains a resin and 70 parts by mass to 130 parts by mass of molybdenum disulfide as a solid lubricant based on 100 parts by mass of the resin, and
the layer comprising the resin composition has a thickness in a range from 0.02 to 0.3 mm.
(2) The entry sheet for drilling according to the above-described (1), wherein the molybdenum disulfide has an average particle diameter of 1 to 20 μm.
(3) The entry sheet for drilling according to the above-described (1) or (2), wherein the molybdenum disulfide has a purity of 85 mass % or more.
(4) The entry sheet for drilling according to any of the above-described (1) to (3), wherein the resin composition contains a water-soluble resin (A).
(5) The entry sheet for drilling according to the above-described (4), wherein the water-soluble resin (A) contains one or two or more water-soluble resins selected from the group consisting of polyethylene oxides; polypropylene oxides; sodium polyacrylates; polyacrylamides; polyvinyl pyrrolidones; cellulose derivatives; polytetra ethylene glycols; polyesters of polyalkylene glycols; polyethylene glycols; polypropylene glycols; monoethers of polyoxyethyienes; polyoxyethylene monostearates; polyoxyethylene sorbitan monostearates; polyglycerol monostearates; and polyoxyethylene-propylene copolymers.
(6) The entry sheet for drilling according to any of the above-described (1) to (5), wherein the resin composition contains a thermoplastic water-insoluble resin.
(7) The entry sheet for drilling according to the above-described (6), wherein the thermoplastic water-insoluble resin contains one or two or more water-insoluble resins selected from the group consisting of amide elastomers, butadiene elastomers, ester elastomers, olefin elastomers, urethane elastomers, styrene elastomers, polybutenes, low density polyethylenes, chlorinated polyethylenes, metallocene polyolefin resins, ethylene/acrylic acid ester/maleic anhydride copolymers, ethylene/glycidyl (meth)acrylate copolymers, ethylene/vinyl acetate copolymer resins, modified ethylene/vinyl acetate copolymer resins, ethylene/(meth)acrylic acid copolymer resins, ionomer resins, and ethylene/(meth)acrylic acid ester copolymer resins.
(8) The entry sheet for drilling according to any of the above-described (1) to (7), wherein the resin composition contains a water-insoluble lubricant that is not a solid lubricant.
(9) The entry sheet for drilling according to the above-described (8), wherein the water-insoluble lubricant that is not a solid lubricant contains one or two or more compounds selected from the group consisting of amide compounds, aliphatic acid compounds, aliphatic acid ester compounds, aliphatic hydrocarbon compounds, and higher aliphatic alcohols.
(10) The entry sheet for drilling according to any of the above-described (1) to (9), wherein the metallic support foil has a thickness in a range from 0.05 to 0.5 mm.
(11) The entry sheet for drilling according to any of the above-described (1) to (10), further comprising a primer layer being a resin film between the metallic support foil and the layer comprising the resin composition, wherein the primer layer has a thickness in a range from 0.002 to 0.02 mm.
(12) The entry sheet for drilling according to the above-described (11), wherein the primer layer contains a solid lubricant containing molybdenum disulfide.
(13) The entry sheet for drilling according to the above-described (12), wherein the primer layer contains 1 part by mass to 50 parts by mass of the molybdenum disulfide based on 100 parts by mass of a composition constituting the primer layer.
(14) The entry sheet for drilling according to any of the above-described (11) to (13), wherein the resin contained in the primer layer contains one or two or more thermosetting resins selected from the group consisting of epoxy resins and cyanate resins.
(15) The entry sheet for drilling according to any of the above-described (11) to (13), wherein the resin contained in the primer layer contains one or two or more thermoplastic resins selected from the group consisting of urethane polymers, vinyl acetate polymers, vinyl chloride polymers, polyester polymers, and acrylic polymers, and copolymers of these polymers.
(16) The entry sheet for drilling according to any of the above-described (11) to (13), wherein the resin contained in the primer layer contains one or two or more adhesive resins selected from the group consisting of melamine resins, urea resins, phenol resins, chloroprene rubber, nitrile rubber, styrene butadiene rubber, and silicone rubber.
(17) The entry sheet for drilling according to any of the above-described (1) to (16), wherein the layer comprising the resin composition is formed on the at least one surface of the metallic support foil by a coating method, the layer comprising the resin composition is obtained by conducting coating on the at least one surface of the metallic support foil with a solution in which the resin composition is dissolved or dispersed in a mixed solvent of water and a solvent having a boiling point lower than the boiling point of water, and the solvent having a boiling point lower than the boiling point of water contains one or two or more solvents selected from the group consisting of alcohols, methyl ethyl ketone, acetone, tetrahydrofuran, and acetonitrile.
(18) The entry sheet for drilling according to the above-described (17), wherein a blending ratio of the water to the solvent having a boiling point lower than the boiling point of water contained in the mixed solvent is in a range from 90/10 to 50/50 on a mass basis.
(19) The entry sheet for drilling according to any of the above-described (1) to (18), the entry sheet to be used for hole boring processing with a drill bit having a diameter of 0.2 mmϕ less.
(20) The entry sheet for drilling according to any of the above-described (1) to (19), the entry sheet to be used for drilling processing of a laminated board or a multi-layer board.

According to the present invention, an entry sheet for drilling that is excellent in hole position accuracy compared with the conventional entry sheet for drilling can be provided.

DESCRIPTION OF EMBODIMENTS

Figure 1:
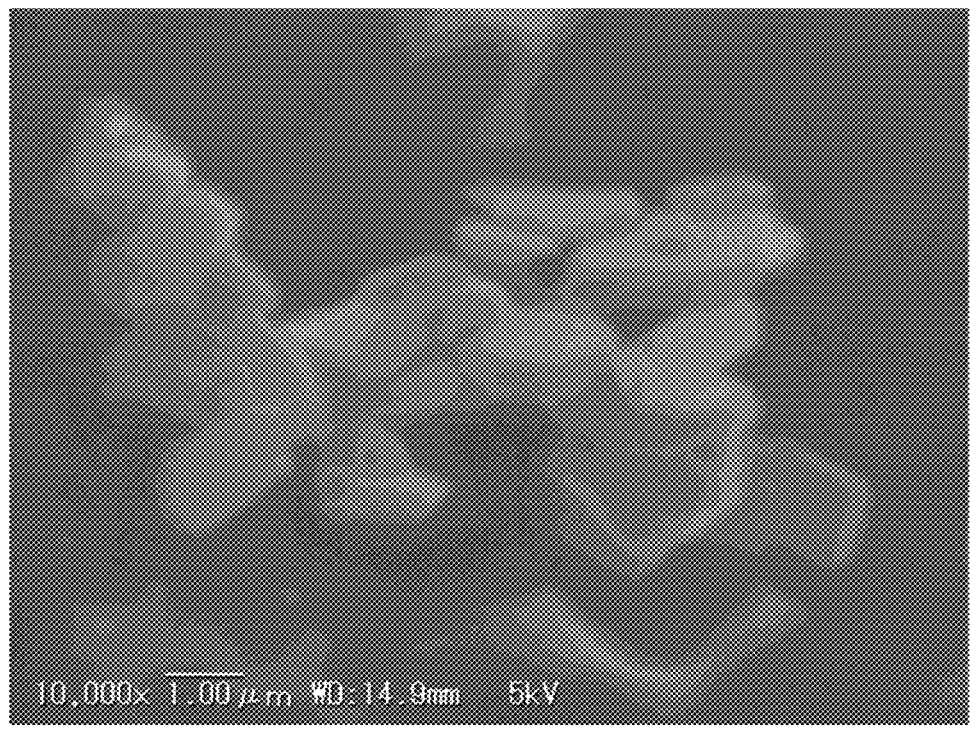
FIG. 1 is a scanning electron micrograph illustrating an example of molybdenum disulfide.

Hereinafter, the embodiment for carrying out the present invention (hereinafter, simply referred to as "the present embodiment") will be described in detail with references to drawings as necessary. In addition, in the drawings, the same signs are provided to the same elements and overlapping descriptions will be omitted. Moreover, the positional relationship of top and bottom, right and left, or the like is based on the positional relationship illustrated in the drawings, unless otherwise noted. Furthermore, the dimension ratio in the drawings is not limited to the dimension ratio illustrated in the drawings. Moreover, a "(meth)acryl" in the present description means an "acryl" and a "methacryl" corresponding to the acryl, and a "(meth)acrylate" means an "acrylate" and a "methacrylate" corresponding to the acrylate.

The entry sheet for drilling in the present embodiment (hereinafter, simply referred to as "entry sheet") is an entry sheet for drilling comprising metallic support foil and a layer comprising a resin composition (hereinafter, simply referred to as a "resin composition layer") formed on at least one surface of the metallic support foil. In the entry sheet for drilling of the present embodiment, the resin composition contains a resin and 70 parts by mass to 130 parts by mass of molybdenum disulfide as a solid lubricant based on 100 parts by mass of the resin, and the resin composition layer has a thickness in a range from 0.02 to 0.3 mm.

In the present embodiment, the solid lubricant is a solid that is used as a thin film or a powder for protecting the drill bit and the surface of a hole wall of the printed wiring board material from damage during relative motion and reducing friction or wear. It is preferable that the solid lubricant have a melting point of 300° C. or more, thereby, even in the air having a temperature (for example, 200° C.) higher than the operating temperature of the entry sheet during drilling, the solid lubricant is thermally more stable, hard to melt, and can maintain the solid state. In addition, it is preferable that the operating temperature of the entry sheet during drilling be 100° C. or more and less than 200° C. even though the temperature is different depending on the drill bit size, the number of rotations of the drill bit (rpm), and the object of processing. For example, in the case of a drill bit having a regular diameter of 0.9 mm$\phi$, the operating temperature may be 120° C.

Moreover, it is preferable that the resin composition of the present embodiment be a composition containing the water-soluble resin (A). Here, the water-soluble resin (A) is a concept that encompasses, in addition to a water-soluble resin, a water-soluble lubricant that is not a solid lubricant. In addition, the lubricant "that is not a solid lubricant" in the present description is a concept that encompasses a liquid lubricant and a semisolid lubricant.

Of course, the resin composition of the present embodiment may contain a publicly known thermoplastic water-insoluble resin or water-insoluble lubricant that is not a solid lubricant and may contain, as another additive, a nucleating agent, a colorant, or a heat stabilizer for example. Here, "water-insoluble" means that the solubility in water at room temperature is 10 mg/dm$^3$ or less. Namely, "water-soluble" in the present description means that the solubility in water at room temperature exceeds 10 mg/dm$^3$.

Examples of the resin contained in the resin composition of the present embodiment include water-soluble resins (A), thermoplastic water-insoluble resins, and water-insoluble lubricants that are not solid lubricants. The resin contained in the resin composition also plays a roll of a carrier that transfers the solid lubricant toward the drill bit and the printed wiring board material other than an original roll of a resin in the entry sheet. Namely, the resin pushes the solid lubricant toward the drill bit and the printed wiring board material during hole boring with a drill bit, and thereby the resin can transfer the solid lubricant toward the drill bit and the printed wiring board material.

The resin composition of the present embodiment preferably contains 70 parts by mass to 130 parts by mass or 80 parts by mass to 110 parts by mass of molybdenum disulfide based on 100 parts by mass of the resin contained in the resin composition, more preferably 80 parts by mass to 100 parts by mass. The object of the present invention can be achieved more effectively and surely by the content of molybdenum disulfide being 70 parts by mass or more. The aggregation of molybdenum disulfide can be suppressed more effectively and surely by the content of molybdenum disulfide being 130 parts by mass or less, and, as a result thereof, the hole position accuracy becomes sufficiently favorable. Moreover, it is preferable that the content of molybdenum disulfide be 130 parts by mass or less: because, thereby, the entry sheet with which the aggregation of molybdenum disulfide is suppressed can be made more easily; and furthermore also from the viewpoint of economic rationality. In addition, in the field of the entry sheet for drilling, there has not been an idea so far that molybdenum disulfide that is more expensive than graphite is blended in a large amount like the present invention. There has been an example in which zinc molybdate or molybdenum trioxide is blended by up to 40 parts by mass based on 100 parts by mass of the resin contained in the resin composition; however, since zinc molybdate or molybdenum trioxide is expensive, the action effect obtained with the premise of blending in a small amount has been sought.

Molybdenum disulfide (MoS$_2$) has the following characteristics. Namely, molybdenum disulfide has a Mohs hardness of 1 to 1.5 and is a soft mineral next to talc. Molybdenum disulfide does not melt when heated and is gradually oxidized from 350° C. in the atmosphere to become molybdenum trioxide (MoO$_3$). Molybdenum disulfide decomposes when further heated. The characteristic of molybdenum disulfide is that the coefficient of friction $\mu$ is smaller than that of graphite that is a commonly used solid lubricant and that the coefficient of friction $\mu$ is stable particularly in a temperature region from 100° C. or more to less than 200° C. because the coefficient of friction is less likely to be affected by humidity in the temperature region. On the other hand, the coefficient of friction $\mu$ of graphite is not necessarily stable and rises in the above-described temperature region.

In the present embodiment, the present inventors have found that when molybdenum disulfide is used as a solid lubricant that is blended in the entry sheet for drilling, there is a critical range of the content where a special improvement in hole position accuracy is exhibited. Namely, it has been understood that the action effect of an outstanding improvement in hole position accuracy is exhibited by molybdenum disulfide contained in the resin composition in a specific rate as compared with zinc molybdate, molybdenum trioxide and the like that have been considered to be a favorable solid lubricant for enhancing the hole position accuracy so far.

It is preferable that molybdenum disulfide have a coefficient of friction $\mu$ of 0.2 or less particularly at a drilling temperature of 100° C. or more and less than 200° C. The method for measuring the coefficient of friction $\mu$ complies with JIS K7125 (1999). The original performance as a solid lubricant can be exhibited more effectively and surely by the coefficient of friction $\mu$ being 0.2 or less. Furthermore, molybdenum disulfide has a purity of preferably 85 mass % or more, more preferably 90 mass % or more, and further more preferably 95 mass % or more. In addition, the upper limit of the purity of molybdenum disulfide is not particularly limited and may be 100 mass % or 99 mass %. The amount of impurity can be made small by molybdenum disulfide having a purity of 85 mass % or more, and therefore the performance as a solid lubricant can be exhibited more effectively. The purity of molybdenum disulfide is measured by a subtracting method. Namely, molybdenum oxide, iron, insoluble residues, carbon, water, and oil contents that are contained in molybdenum disulfide are determined as impurities, a numerical value obtained by subtracting the mass of the impurities from the total mass is determined as the mass of molybdenum disulfide, and a mass ratio of molybdenum disulfide based on the total mass is determined as the purity of molybdenum disulfide. In addition, other methods for measuring the purity of molybdenum disulfide include an ICP (Inductively Coupled Plasma) mass analysis method.

The mechanism of the action exerted by the solid lubricant is roughly considered as follows. However, the mechanism of the action is not limited to this. Namely, the drill bit is heated by frictional heat generated between the drill bit and the object of hole boring (for example, a printed wiring board material such as a laminated board or a multi-layer board) during drilling. Thereby, the temperature of the resin composition around the drill bit becomes higher than the melting point of the resin contained in the resin composition, and therefore the resin melts to exhibit the action of imparting a lubricating property. However, as a side effect thereof, the drill bit is liable to slide due to the melting or thermal deformation of the resin contained in the resin composition.

Figure 8:
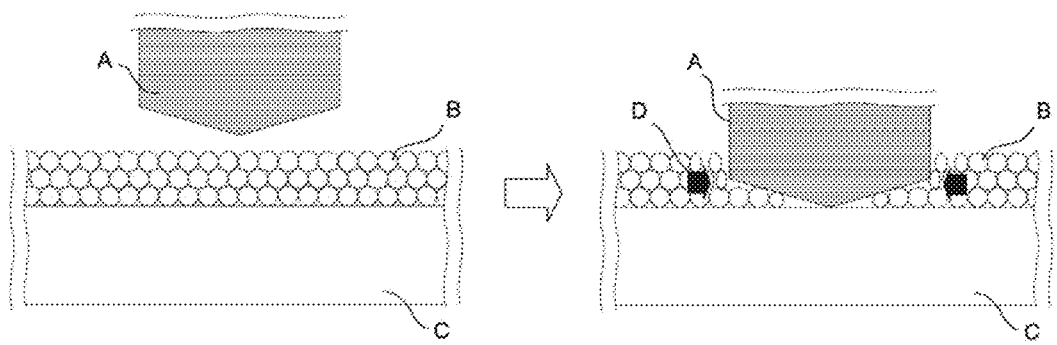
FIG. 8 is a diagram for describing the centripetal force of a drill bit.
Figure 9:
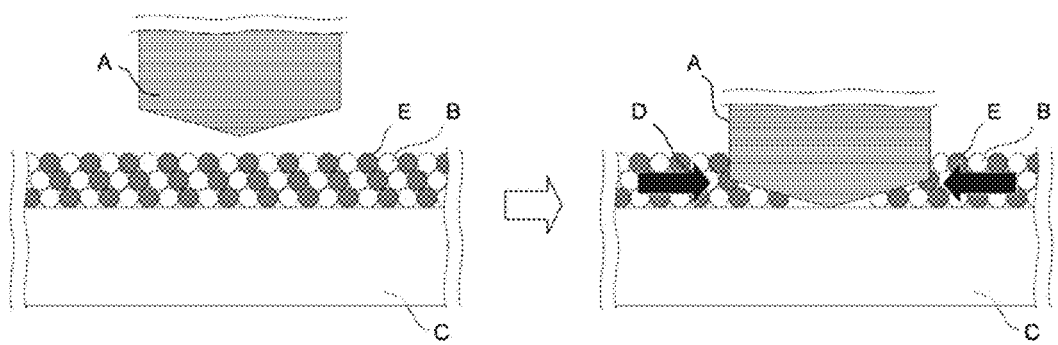
FIG. 9 is a diagram for describing the centripetal force of a drill bit.

Each of FIGS. 8 and 9 is a diagram schematically illustrating the way how a drill bit intrudes into an entry sheet during drilling, a water-soluble resin (A) that becomes a crystal represented by the sign B is used as a resin, FIG. 8 illustrates a case where the resin composition does not contain a solid lubricant, and FIG. 9 illustrates a case where the resin composition contains molybdenum dioxide as a solid lubricant. In the case as illustrated in FIG. 8 where the resin composition containing the water-soluble resin (A) B does not contain the solid lubricant, the tip of the drill bit A intrudes into the resin composition layer and is to find the point that the drill bit bites while sliding. Since the resin composition around the drill bit A is in a soft state, the centripetal force D applied to the drill bit A becomes weak and it is hard to stop sliding of the drill bit A. Therefore, there is a limit to an improvement in hole position accuracy. Thus, the present inventors have found to blend molybdenum disulfide as a solid lubricant and optimize the amount thereof to be blended.

In the first place, molybdenum disulfide that is a solid lubricant has a moderate hardness. And molybdenum disulfide maintains a solid state the shape of which is fixed and the position thereof becomes easily fixed even under the temperature during drilling. As a result thereof, in the case as illustrated in FIG. 9 where the resin composition containing the water-soluble resin (A) B contains molybdenum dioxide E as a solid lubricant, the tip of the drill bit A is to bite the solid lubricant E the shape or position of which is fixed when the tip of the drill bit A intrudes into the resin composition layer. So, the centripetal force D becomes strong, and the action effect that gives excellent hole position accuracy particularly in the initial stage and at cumulative 3,000 hits is brought about.

In the second place, molybdenumdisulfide E that is a solid lubricant maintains the solid state the shape of which is fixed even under the temperature during drilling and therefore can suppress the thermal deformation of the resin composition and the sliding of the drill hit A. So, the drill bit A can obtain sufficient centripetal force D to improve the hole position accuracy. As a result thereof, the remarkable action effect that gives excellent hole position accuracy even at cumulative 6,000 hits where the wear of the drill bit A is progressed is brought about.

In the third place, molybdenum disulfide E is adhered to a groove of the drill bit A, and therefore the lubricating property is enhanced by the solid lubricating action of molybdenum disulfide. As a result thereof, the discharge of chips becomes smooth to prevent the chips from becoming a lump and dropping, and it becomes possible to prevent the breakage of the drill bit that can happen by the drill bit A stepping on the chips in a lump state.

In the fourth place, molybdenum disulfide E that is a solid lubricant is adhered to the surface or groove of the drill bit A and the hole wall of the object of hole boring. Since molybdenum disulfide E that is a solid lubricant is a solid and therefore the shape is fixed, the molybdenum disulfide is always present between the object of hole boring and the drill bit A to enhance the lubricating property, and it becomes possible to bring about the action effect to suppress the wear of the drill bit.

Molybdenum disulfide that is a solid lubricant may be contained in a resin film (described later in detail. Hereinafter, also referred to as "primer layer".) that may be provided between the metallic support foil and the resin composition layer. Since the primer layer makes direct contact with the metallic support foil (for example, aluminum foil), the effect of improving the hole position accuracy by molybdenum disulfide can be brought about by molybdenum disulfide being contained in the primer layer, even though molybdenum disulfide is present just near the metallic support foil. Particularly, the effect of improving the hole position accuracy is further enhanced by molybdenum disulfide being contained in the primer layer so that the particles are making contacts with one another (in the closest packing state). Molybdenum disulfide is contained preferably in an amount from 1 part by mass to 50 parts by mass based on 100 parts by mass of a composition that constitutes the primer layer, more preferably 5 parts by mass to 30 parts by mass. The action effect exerted by molybdenum disulfide can be brought about more effectively and surely by the content of molybdenum disulfide being 1 part by mass or more. The adhesiveness between the thin primer layer and the metallic support foil can be maintained at a higher level by the content of molybdenum disulfide being 50 parts by mass or less. The resin that constitutes the primer layer containing molybdenum disulfide may be any of thermosetting resins and thermoplastic resins and may also be an adhesive resin.

It is more preferable that the optimum particle diameter and content of molybdenum disulfide be selected within a specific range according to the specification of the object of hole boring including a printed wiring board material, for example, a laminated board or a multi-layer board. Molybdenum disulfide is a solid which has a layered structure; the shape of which is fixed; and which has a moderate hardness. Molybdenum disulfide contained in the resin composition has preferably a particle diameter in a range from 0.1 µm to 50 µm, more preferably a particle diameter in a range from 0.5 µm to 29 µm. Molybdenum disulfide has an average particle diameter of preferably 1 µm to 20 µm, more preferably 1 µm to 15 µm, further more preferably 1 µm to 10 µm, and particularly preferably 3 µm to 8 µm. For the drill bit having a small diameter for which the hole position accuracy is important, the drill bit particularly easily bites to molybdenum disulfide because of its characteristics. Moreover, molybdenum disulfide has a layered structure and a thin shape, therefore easily gets wound in the groove of the drill bit during the rotation of the drill bit, and also contributes to the discharge of the chips. The position of the solid lubricant the shape of which is fixed also becomes more easily fixed by molybdenum disulfide having an average particle diameter of 1 µm or more, and therefore the function as a solid lubricant is brought about more effectively and surely. On the other hand, in the case where molybdenum disulfide has an average particle diameter of 20 µm or less, it becomes possible to make the hole position accuracy more excellent and proceed with the discharge of the chips further smoothly.

Regarding the particle diameter of molybdenum disulfide, the average particle diameter value is more important than the maximum particle diameter value. The reason is because the particle diameter as a whole of molybdenum disulfide contained in the resin composition in a high ratio as high as 70 parts by mass to 130 parts by mass based on 100 parts by mass of the resin gives a larger impact on the hole position accuracy and the lubricating property that are the characteristics of the entry sheet for drilling. Therefore, it becomes more important to control the average particle diameter than to control the maximum particle diameter of molybdenum disulfide for the purpose of improving the performance of the entry sheet for drilling. In the method for measuring the particle size of the solid lubricant such as molybdenum disulfide, first of all, a sample is dispersed in a solution comprising a 0.2% hexametaphosphoric acid solution and a few drops of a 10% Triton, and the maximum length of each projected particle of the solid lubricant is measured using a laser diffraction particle size distribution measuring apparatus (type number: SALD-2100, manufactured by Shimadzu Corporation). Next, a particle size distribution curve is created from the measurement results. The range from the maximum particle diameter to the minimum particle diameter that the curve shows is determined to be the range of the particle diameter for the solid lubricant, and moreover the particle diameter where the content on a volume basis of the solid lubricant in the particle size distribution curve is the highest is determined to be the average particle diameter.

Molybdenum disulfide has a non-swelling property. Therefore, it is not necessary to strictly control the degree of moisture unlike a swelling solid lubricant, and molybdenum disulfide is industrially advantageous. Here, as for the definition of the non-swelling property, an aqueous solution obtained by blending 10 parts by mass of the solid lubricant in 90 parts by mass of water is housed in a vessel having a constant inside diameter in the height direction of a beaker, flask or the like and a flat inside bottom surface and is stirred till the mixture is sufficiently mixed. Thereafter, the mixture is left standing for 1 hour, the height of precipitation of the solid lubricant is measured, and the case where the precipitation height ratio (the ratio of the height from the inside bottom surface to the upper surface of the precipitate of the solid lubricant to the height from the inside bottom surface of the vessel to the liquid level of the aqueous solution) is less than 50% is defined as non-swelling. In addition, the case where the precipitation height ratio is 90% or more is defined as dispersing or swelling, and the case where the precipitation height ratio is 50% or more and less than 90% is defined as swelling. There exists an example in which molybdenum disulfide of the present embodiment has a height from the inside bottom surface to the liquid level of 68 mm, a height from the inside bottom surface to the upper surface of the precipitate of molybdenum disulfide of 28 mm and a precipitation height ratio of 41.2%, and two-phase separation has clearly occurred.

Such a characteristic has strong points as described below when the resin contained in the resin composition is the water-soluble resin (A) and a solution (dispersion liquid) containing the water-soluble resin (A) and molybdenum disulfide is produced in preparing an entry sheet. First of all, molybdenum disulfide is easily dispersed in the liquid uniformly and hard to aggregate. As a result thereof, it becomes possible for molybdenum disulfide to be favorably dispersed over the whole sheet also in the obtained entry sheet. Moreover, when molybdenum disulfide is left in the hole after hole boring processing, it becomes easy to conduct cleaning. However, it is preferable to sufficiently conduct stirring so as not to generate the concentration gradient of molybdenum disulfide in producing the solution of the water-soluble resin (A).

The water-soluble resin (A) is not particularly limited. The water-soluble resin (A) is, as described above, a concept that encompasses a water-soluble resin and a water-soluble lubricant that is not a solid lubricant. The water-soluble resin is preferably one or two or more selected from the group consisting of, for example, polyethylene oxides, polypropylene oxides, sodium polyacrylates, polyacrylamides, polyvinyl pyrrolidones, cellulose derivatives, polytetramethylene glycols, and polyesters of polyalkylene glycols. The polyester of a polyalkylene glycol is a condensate obtained by reacting a polyalkylene glycol with a dibasic acid. Examples of the polyalkylene glycol include polyethylene glycols, polypropylene glycols, polytetramethylene glycols, and glycols such as the copolymers of these glycols. Examples of the dibasic acid include partial esters and acid anhydrides of polycarboxylic acids such as phthalic acid, isophthalic acid, terephthalic acid, sebacic acid, and pyromellitic acid. These may be used alone or in combination of two or more.

Moreover, examples of the water-soluble lubricant that is not a solid lubricant include polyethylene glycols, and polypropylene glycols; monoethers of polyoxyethylenes such as polyoxyethylene oleyl ethers, polyoxyethylene cetyl ethers, polyoxyethylene stearyl ethers, polyoxyethylene lauryl ethers, polyoxyethylene nonylphenyl ethers, and polyoxyethylene octyl phenyl ethers; polyoxyethylene monostearates and polyoxyethylene sorbitan monostearates; polyglycerol monostearates such as hexaglycerol monostearate and decahexaglycerol monostearate; and polyoxyethylene-propylene copolymers. These may be used alone or in combination of two or more.

The thermoplastic water-insoluble resin is not particularly limited, and publicly known materials are applicable. Examples of the thermoplastic water-insoluble resin include amide elastomers, butadiene elastomers, ester elastomers, olefin elastomers, urethane elastomers, styrene elastomers, polybutenes, low density polyethylenes, chlorinated polyethylenes, metallocene polyolefin resins, ethylene/acrylic acid ester/maleic anhydride copolymers, ethylene/glycidyl (meth)acrylate copolymers, ethylene/vinyl acetate copolymer resins, modified ethylene/vinyl acetate copolymer resins, ethylene/(meth)acrylic acid copolymer resins, ionomer resins, and ethylene/(meth)acrylic acid ester copolymer resins. These may be used alone or in combination of two or more.

The water-insoluble lubricant that is not a solid lubricant is not particularly limited, and publicly known materials are applicable. Examples of the water-insoluble lubricant that is not a solid lubricant include amide compounds such as ethylene bis-stearamide, oleamide, stearic acid amide, and methylene bis-stearyl amide; aliphatic acid compounds such as lauric acid, stearic acid, palmitic acid, and oleic acid; aliphatic acid ester compounds such as butyl stearate, butyl oleate, and glycol laurate; aliphatic hydrocarbon compounds such as liquid paraffins, and polyethylene waxes; and higher aliphatic alcohols such as olein alcohol. These may be used alone or in combination of two or more.

The thickness of the resin composition layer is different depending on the diameter of the drill bit that is used in conducting drilling processing, the constitution of the object of hole boring to which processing is conducted (for example, a printed wiring board material such as a laminated board or a multi-layer board), and the like. The resin composition layer has a thickness preferably in a range from 0.02 to 0.3 mm, more preferably in a range from 0.02 to 0.2 mm. More sufficient lubricating effect can be obtained by the resin composition layer having a thickness of 0.02 mm or more, the load to the drill bit is reduced, and therefore the breakage of the drill bit can be further suppressed. On the other hand, winding of the resin composition to the drill bit can be suppressed by the resin composition layer having a thickness of 0.3 mm or less.

Moreover, examples of the method for forming the resin composition layer include a method for forming a resin composition (coating method) by conducting coating on at least one surface of the metallic support foil directly or indirectly with a dissolved liquid obtained by appropriately melting the resin composition or a liquid in which the resin composition is dissolved or dispersed in a solvent (hereinafter, simply referred to as a "resin composition solution") and thereafter drying, cooling, or solidifying the coating liquid. Alternatively, the method for forming the resin composition layer may be a method in which a sheet of the resin composition is prepared in advance and laminated to the metallic support foil (hot melt method). In laminating the sheet of the resin composition, it is preferable for the purpose of laminating and integrating the metallic support foil and the resin composition layer that a resin film (primer layer) be formed in advance on one surface of the metallic support foil where the resin composition layer is to be formed. The details will be described later.

Furthermore, when the method of conducting coating on at least one surface of the metallic support foil directly or indirectly with the resin composition solution and thereafter drying, cooling, or solidifying by the coating method or the like is adopted, it is preferable that the solvent to be used be a mixed solvent containing water and a solvent having a boiling point lower than the boiling point of water. The use of the mixed solvent containing water and a solvent having a boiling point lower than the boiling point of water contributes to generating a dense spherocrystal and reducing residual bubbles in the resin composition. The solvent having a boiling point lower than the boiling point of water is not particularly limited, examples thereof include alcohols such as ethanol, methanol, and isopropyl alcohol, and low boiling point solvents such as methyl ethyl ketone and acetone can also be used. Examples of another solvent include a solvent obtained by mixing tetrahydrofuran or acetonitrile that has high compatibility with the resin composition with water and alcohols as a part of water and alcohols. The blending ratio of water to the solvent having a boiling point lower than the boiling point of water (water/solvent having a lower boiling point) is preferably in a range from 90/10 to 50/50 on a mass basis, more preferably in a range from 80/20 to 50/50, more preferably in a range from 70/30 to 50/50, and further more preferably in a range from 60/40 to 50/50. The dense spherocrystal becomes more easily generated when the water-soluble resin (A) is used by the blending ratio of the solvent having a boiling point lower than the boiling point of water being 10 or more. It becomes possible to industrially produce the entry sheet more stably by the blending ratio of the solvent having a boiling point lower than the boiling point of water being 50 or less.

Moreover, when the method of conducting coating on at least one surface of the metallic support foil directly or indirectly with the resin composition solution and thereafter heating and drying or cooling and solidifying by a coating method, a hot melt method or the like is adopted, the entry sheet for drilling in heating and drying has a temperature of preferably 120° C. to 160° C., cooling and solidifying are conducted preferably at normal temperature, and cooling is conducted so that the temperature is preferably decreased to normal temperature (for example, 10 to 30° C.) in 5 to 30 seconds after heating and drying. It is possible to industrially produce the entry sheet more stably by the heating temperature being 160° C. or less. Moreover, generating dew condensation in the post-process can be suppressed by the cooling temperature being at normal temperature.

The metallic support foil that is used for the entry sheet for drilling in the present embodiment is not particularly limited, but is preferably a metal material that has high adhesion with the resin composition layer and is capable of enduring the shock by the drill bit. The metallic support foil has a thickness of preferably 0.05 to 0.5 mm, more preferably 0.05 to 0.3 mm. Generation of burrs from the object of hole boring (for example, a laminated board) during drilling processing can be suppressed by the metallic support foil having a thickness of 0.05 mm or more. Moreover, the discharge of chips generated during drilling processing becomes easier by the metallic support foil having a thickness of 0.5 mm or less. It is preferable from the viewpoint of availability, cost, and processability that the kind of metal of the metallic support foil be aluminum. Moreover, it is preferable from the same viewpoint that the material quality of aluminum foil be aluminum having a purity of 95% or more. Examples of such aluminum foil include 5052, 3004, 3003, 1 N30, 1N99, 1050, 1070, 1085, and 8021 specified in JIS-H4160. The shock by the drill bit is lessened and the biting property with the tip of the drill bit is improved by using aluminum foil having an aluminum purity of 95% or more as metallic support foil, these are coupled with the lubricating effect of the drill bit by the resin composition, and the hole position accuracy of processed holes can further be enhanced.

Moreover, it is preferable to use the metallic support foil having a resin film (primer layer) formed in advance on the surface thereof from the standpoint of adhesion with the resin composition layer. From the viewpoint of adhesion, cost, and the hole boring property, the primer layer has a thickness of preferably 0.002 to 0.02 mm, more preferably 0.002 to 0.01 mm. In the case where molybdenum disulfide is contained as a solid lubricant in the primer layer, the thickness of the primer layer can appropriately be selected according to the particle diameter of molybdenum disulfide. It is preferable that the resin contained in the primer layer can improve adhesion with the resin composition layer, and the resin contained in the primer layer may be any of thermoplastic resins and thermosetting resins, or may be an adhesive resin. Examples of the thermoplastic resin include urethane polymers, vinyl acetate polymers, vinyl chloride polymers, polyester polymers, acrylic polymers, and copolymers of these polymers. Examples of the thermosetting resin include epoxy resins and cyanate resins. Examples of the adhesive resin that functions as an adhesive agent include, other than the above-described resins, synthetic resins such as melamine resins, urea resins, and phenol resins, and synthetic rubber such as chloroprene rubber, nitrile rubber, styrene butadiene rubber, and silicone rubber. The resin contained in the primer layer may be used alone or in combination of two or more.

The thickness of each layer that constitutes the entry sheet for drilling is measured by the following manner. Namely, the entry sheet for drilling is cut in the lamination direction of each layer from the surface on the side of the resin composition layer of the entry sheet for drilling using a cross-section polisher (manufactured by JEOL Ltd., product name "CROSS-SECTION POLISHER SM-09010") or an ultramicrotome (manufactured by Leica, product name "EM UC7"). Thereafter, the cross section appeared by cutting is observed from a vertical direction relative to the cross section to measure the thicknesses of the metallic support foil and the resin composition layer, and the primer layer as necessary using a SEM (Scanning Electron Microscope, manufactured by KEYENCE CORPORATION, item number "VE-7800"). The thicknesses at 5 points to 1 view are measured, and the average is determined to be the thickness of each layer.

It is preferred to use the entry sheet for drilling according to the present embodiment for drilling processing in a laminated board or a multi-layer board, because the objects of the present invention can be achieved more effectively and reliably. Further, if that drilling processing is carried out using a drill bit with a diameter (drill bit diameter) of 0.2 mmφ or less, preferably a diameter of 0.05 mmφ or more and 0.2 mmφ or less, the object of the present invention can be achieved even more effectively and reliably. The entry sheet for drilling according to the present embodiment is suitable for small diameter drill bit applications with a diameter of 0.05 mmφ or more to 0.15 mmφ or less, particularly suitable for very small diameter drill bit applications with a diameter of 0.05 mmφ or more to 0.105 mmφ or less, for which hole position accuracy is important, because drill bit breakages can be remarkably reduced. Here, a drill bit diameter of 0.05 mmφ is the lower limit of a diameter of commercially-available drill bits. If drill bits having a smaller diameter than this become available, the above-described lower limit will change accordingly. Further, there is no problem in employing the entry sheet according to the present embodiment in drilling processing that uses a drill bit having a diameter of more than 0.2 mmφ.

The entry sheet for drilling of the present embodiment is used in conducting drilling processing to, for example, a printed wiring board material, more specifically, a laminated board or a multi-layer board. More specifically, the drilling processing can be conducted from the upper surface (the surface of the resin composition layer) of the entry sheet for drilling by arranging the entry sheet on at least the top surface of a laminated board or a multi-layer board or a plurality of laminated boards or multi-layer boards which are piled up (a printed wiring board material) so that the metallic support foil side makes contact with the printed wiring board material.

The entry sheet for drilling of the present embodiment can reduce the breakage of the drill bit during hole boring processing due to excellent hole position accuracy and excellent lubricating property of the resin composition layer during hole boring processing. As a result thereof, higher density designing is made possible, and hole boring processing that is high quality and excellent in productivity is made possible. Alternatively, it becomes possible to increase the number of piled boards to which hole boring processing is conducted at a time, and as a result, the entry sheet for drilling of the present embodiment contributes to improvements in productivity and reduction in cost.

The embodiment for carrying out the present invention has been described above, however the present invention is not limited to the above-described embodiment. Various modifications can be added to the present invention within a range not deviating the gist of the present invention.

EXAMPLES

Hereinafter, the effects of Examples of the present invention will be described comparing with Comparative Examples that are out of the range of the present invention. However, the present invention is not limited to these Examples. In addition, "polyethylene glycol" is sometimes abbreviated as "PEG", and "polyethylene oxide" is sometimes abbreviated as "PEO".

Example 1

In a water/MeOH (methanol) mixed solution, 30 parts by mass of a polyethylene oxide having a weight average molecular weight of 150,000 (manufactured by Meisei Chemical Works, Ltd., product name: ALTOP MG-150) and 70 parts by mass of a polyethylene glycol having a weight average molecular weight of 20,000 (manufactured by Sanyo Chemical Industries, Ltd., product name: PEG 20000) were dissolved so that the solid content of the resins became 30 mass %. The ratio of water to MeOH at that time was set to 60/40 on a mass basis. Furthermore, in the solution of the water-soluble resin composition, 80 parts by mass of molybdenum disulfide (manufactured by Daizo Corporation, range of particle diameter: 0.5 μm to 29 μm, average particle diameter: 5 μm, molybdenum disulfide purity: 98%, coefficient of friction μ: 0.4) based on 100 parts by mass of the resins contained in the water-soluble resin composition was blended as a solid lubricant, and was sufficiently dispersed. Coating was conducted with the resin composition solution thus obtained using a bar coater on the resin film surface side of aluminum foil (aluminum foil that was used: 1100, thickness 0.1 mm, manufactured by Mitsubishi Aluminum Co., Ltd.) obtained by forming an epoxy resin film having a thickness of 0.01 mm on one surface so that the thickness of the resin composition layer after drying became 0.05 mm, drying was conducted at 120° C. for 5 minutes in a dryer, and thereafter cooling to normal temperature was conducted to thereby prepare an entry sheet for drilling. In addition, a scanning electron micrograph (magnifications: 10000) of a part of molybdenum disulfide used in the present Example is illustrated in FIG. 1.

Example 2

In accordance with Example 1, a resin composition solution was prepared with the kinds and the contents of respective materials shown in Table 1 to make an entry sheet for drilling having a thickness of a resin composition layer after drying of 0.05 mm.

Comparative Examples 1 to 22

In accordance with Example 1, resin composition solutions were prepared with the kinds and the contents of respective materials shown in Table 1 to make entry sheets for drilling each having a thickness of a resin composition layer after drying of 0.05 mm.
<Evaluation Methods>
The following evaluation was conducted for each sample of the entry sheets for drilling made in Examples and Comparative Examples.
(1) Hole Position Accuracy
The entry sheet for drilling was arranged on the piled copper clad laminated boards with the resin composition layer on the upper side, and drilling processing was conducted. Drilling processing of 6,000 hits per one drill bit was conducted and repeated using 4 drill bits. The shift of hole position at the back surface (lower surface) of the lowest board of the piled copper clad laminated boards from the designated coordinate was measured for each hole of 1 to 1,500 hits, 1 to 3,000 hits, 1 to 4,500 hits, and 1 to 6,000 hits per every drill bit using a hole analyzer (type number: HA-1AM, manufactured by Hitachi Via Mechanics, Ltd.). This deviation was calculated as the "mean+3σ" by calculating the mean and the standard deviation (σ) of each drill bit. Then, the mean value of each "mean+3σ" was calculated for used 4 drill bits and taken as the hole position accuracy of the overall drilling processing. The equation that was used is as follows. The results of 1 to 3,000 hits and 1 to 6,000 hits are shown in Table 1.

$$\text{Hole Position Accuracy } (\mu m) \text{ of the overall drilling} = \left(\sum_{i=1}^{n} \text{"mean} + 3\sigma_i\text{"} \text{ of drill bit}\right) \div n \quad \text{[Formula 1]}$$

(wherein $n$ represent the number of used drills.)

Figure 4:
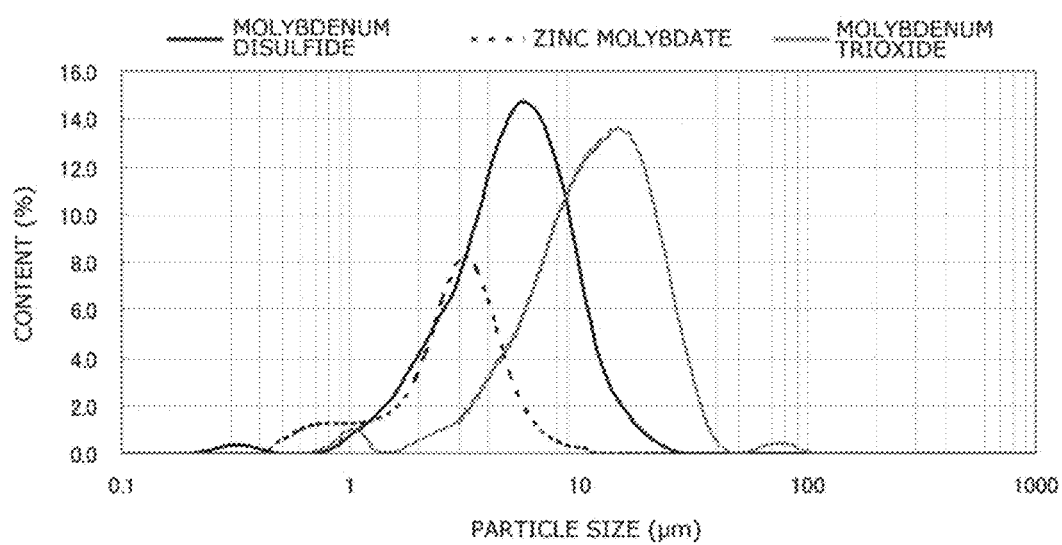
FIG. 4 is a particle size distribution curve illustrating an example of particle size distribution of a solid lubricant.

The hole position accuracy was evaluated based on the evaluation criteria shown in Table 1 while using the hole position accuracy of an cumulative number of holes bored of 3,000 hits where the wear of the drill bit was not relatively progressed and the hole position accuracy of an cumulative number of holes bored of 6,000 hits where the wear of the drill bit was relatively progressed as reference. The lower evaluation of the hole position accuracy of an cumulative number of holes bored of 3,000 hits and the hole position accuracy of an cumulative number of holes bored of 6,000 hits was determined to be the overall evaluation. Hereat, "Excellent" represents that the hole position accuracy is extremely excellent, "Good" represents that the hole position accuracy is good, "Fair" represents that the hole position accuracy is slightly bad, and "Poor" represents that the hole position accuracy is bad,
(2) Particle Size of Solid Lubricant
The particle size of the solid lubricant was measured in the following manner. First of all, a sample of the solid lubricant was dispersed in a solution comprising a 0.2% hexametaphosphoric acid solution and a few drops of 10% Triton, and the maximum length of each projected particle of the solid lubricant was measured using a laser diffraction particle size distribution measuring apparatus (type number: SALD-2100, manufactured by Shimadzu Corporation). Next, a particle size distribution curve was created from the measurement results. The range from the maximum particle diameter to the minimum particle diameter that the curve showed was determined to be the range of the particle diameter for the solid lubricant, and moreover the particle diameter where the content on a mass basis of the solid lubricant in the particle size distribution curve was the highest was determined to be the average particle diameter. The particle size distribution curves of molybdenum disulfide, zinc molybdate, and molybdenum trioxide are shown in FIG. 4. The order of average particle diameters was zinc molybdate, molybdenum disulfide, and molybdenum trioxide in the ascending order.

TABLE 1

| | Water soluble resin (A) | Solid lubricant Kind | Solid lubricant Content Parts by mass | Hole boring processing condition | Hole position accuracy in cumulative number of holes bored 3,000 hits Ave. μm | Hole position accuracy in cumulative number of holes bored 3,000 hits Evaluation | Hole position accuracy in cumulative number of holes bored 6,000 hits Ave. μm | Hole position accuracy in cumulative number of holes bored 6,000 hits Evaluation | Overall evaluation |
|---|---|---|---|---|---|---|---|---|---|
| Example 1 | 1 | 2 | 80 | 1 | 16.8 | Excellent | 21.3 | Excellent | Excellent |
| Example 2 | 1 | 2 | 100 | 1 | 19.0 | Good | 22.3 | Good | Good |
| Comparative Example 1 | 1 | 5 | 0 | 1 | 29.3 | Poor | 35.5 | Poor | Poor |
| Comparative Example 2 | 1 | 2 | 5 | 1 | 23.7 | Poor | 31.4 | Poor | Poor |
| Comparative Example 3 | 1 | 2 | 10 | 1 | 20.3 | Fair | 31.1 | Poor | Poor |
| Comparative Example 4 | 1 | 2 | 20 | 1 | 25.4 | Poor | 35.8 | Poor | Poor |
| Comparative Example 5 | 1 | 2 | 40 | 1 | 27.1 | Poor | 37.1 | Poor | Poor |

TABLE 1-continued

| | Water soluble resin (A) | Solid lubricant Kind | Content Parts by mass | Hole boring processing condition | Hole position accuracy in cumulative number of holes bored | | | | Overall evaluation |
|---|---|---|---|---|---|---|---|---|---|
| | | | | | 3,000 hits | | 6,000 hits | | |
| | | | | | Ave. μm | Evaluation | Ave. μm | Evaluation | |
| Comparative Example 6 | 1 | 2 | 60 | 1 | 21.9 | Fair | 28.5 | Fair | Fair |
| Comparative Example 7 | 1 | 2 | 200 | 1 | 22.0 | Poor | 28.7 | Fair | Poor |
| Comparative Example 8 | 1 | 3 | 5 | 1 | 20.9 | Fair | 26.9 | Fair | Fair |
| Comparative Example 9 | 1 | 3 | 10 | 1 | 20.4 | Fair | 29.6 | Fair | Fair |
| Comparative Example 10 | 1 | 3 | 20 | 1 | 23.5 | Poor | 29.5 | Fair | Poor |
| Comparative Example 11 | 1 | 3 | 40 | 1 | 23.8 | Poor | 25.8 | Fair | Poor |
| Comparative Example 12 | 1 | 3 | 60 | 1 | 25.9 | Poor | 34.8 | Poor | Poor |
| Comparative Example 13 | 1 | 3 | 80 | 1 | 25.5 | Poor | 26.7 | Fair | Poor |
| Comparative Example 14 | 1 | 3 | 90 | 1 | 28.4 | Poor | 35.6 | Poor | Poor |
| Comparative Example 15 | 1 | 4 | 5 | 1 | 26.5 | Poor | 33.8 | Poor | Poor |
| Comparative Example 16 | 1 | 4 | 10 | 1 | 20.1 | Fair | 26.2 | Fair | Fair |
| Comparative Example 17 | 1 | 4 | 20 | 1 | 25.2 | Poor | 35.4 | Poor | Poor |
| Comparative Example 18 | 1 | 4 | 40 | 1 | 25.9 | Poor | 36.1 | Poor | Poor |
| Comparative Example 19 | 1 | 4 | 60 | 1 | 26.1 | Poor | 34.1 | Poor | Poor |
| Comparative Example 20 | 1 | 4 | 80 | 1 | 25.8 | Poor | 31.4 | Poor | Poor |
| Comparative Example 21 | 1 | 4 | 100 | 1 | 29.0 | Poor | 33.6 | Poor | Poor |
| Comparative Example 22 | 1 | 4 | 200 | 1 | 34.2 | Poor | 38.5 | Poor | Poor |
| Evaluation criteria | | | | | Excellent: less than 18 μm Good: less than 20 μm Fair: less than 22 μm Poor: 22 μm or more | | Excellent: less than 22 μm Good: less than 25 μm Fair: less than 30 μm Poor: 30 μm or more | | |

Figure 5:
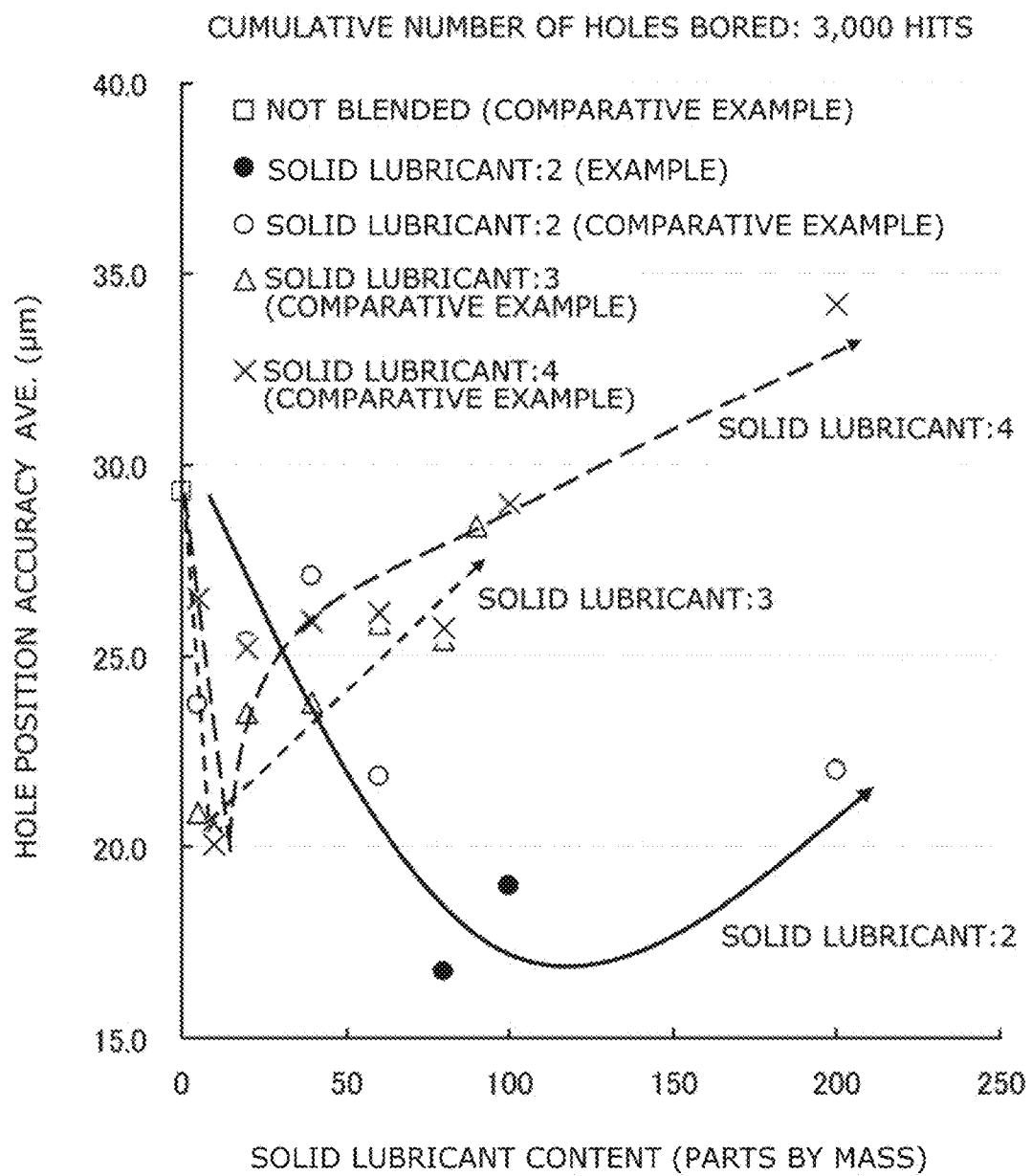
FIG. 5 is a diagram comparing hole position accuracy between Examples and Comparative Examples.
Figure 6:
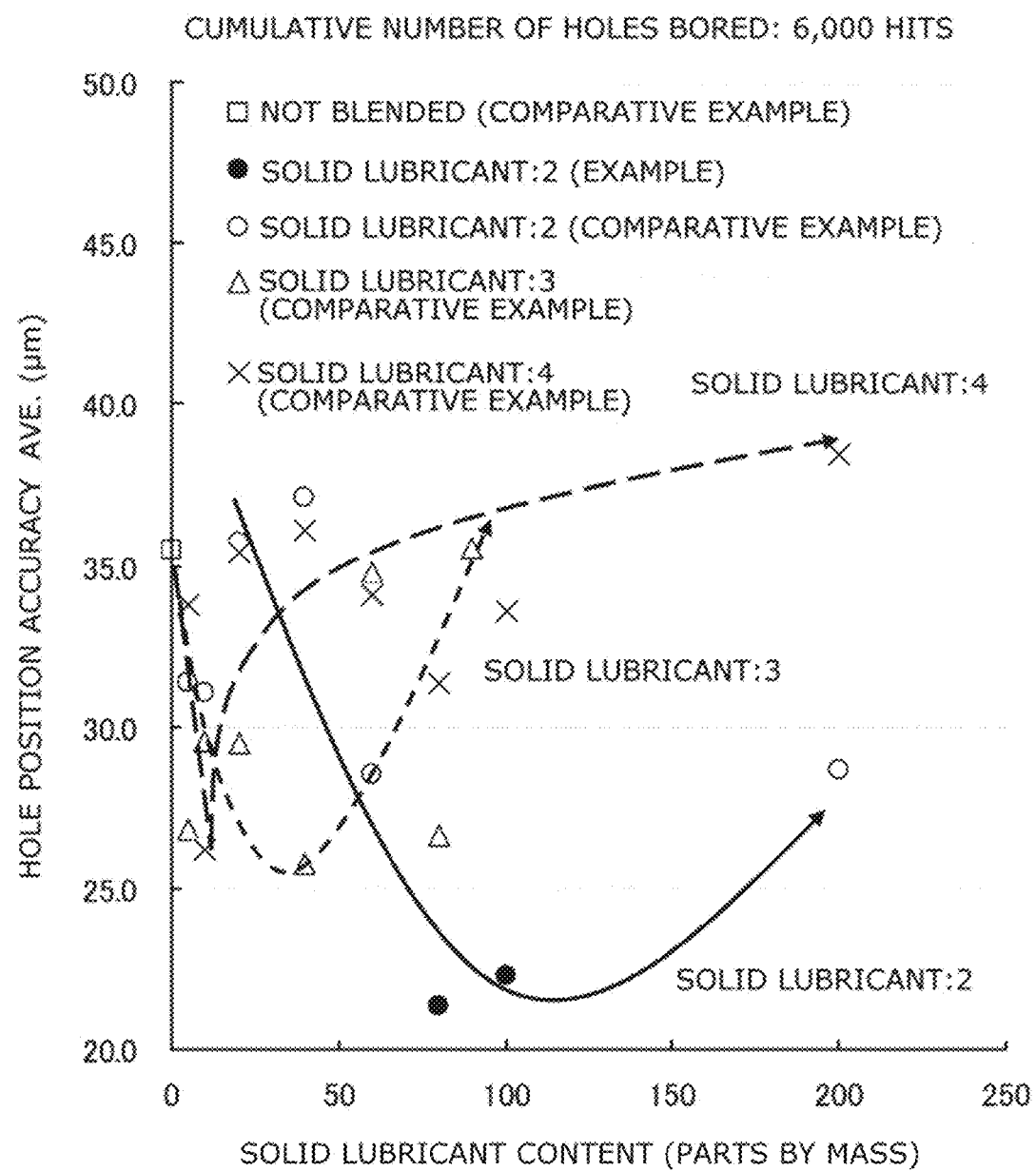
FIG. 6 is a diagram comparing hole position accuracy between Examples and Comparative Examples.
Figure 7:
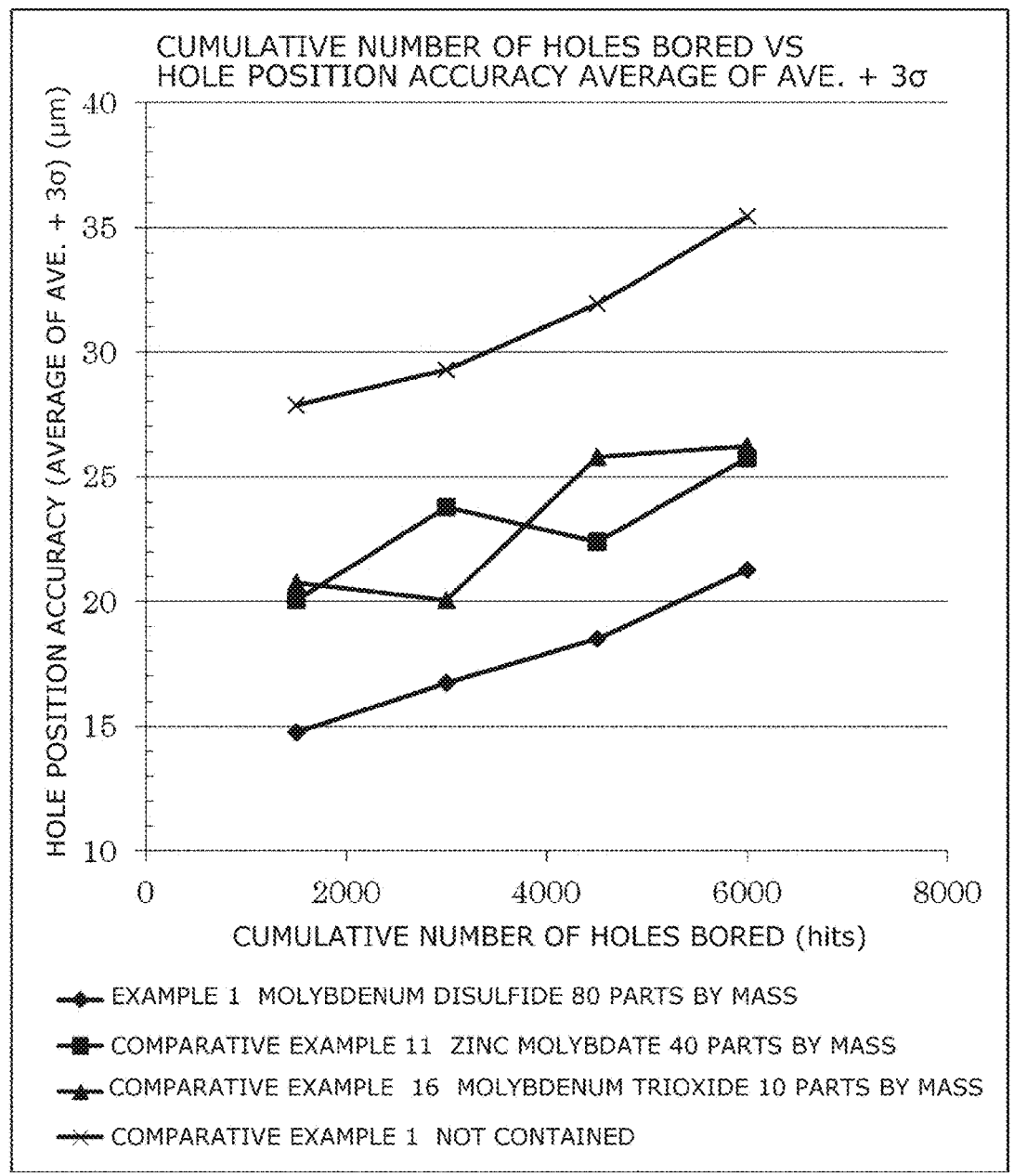
FIG. 7 is a diagram obtained by plotting hole position accuracy against cumulative number of holes bored.

With regard to Example 1 from which most favorable result was obtained in Examples shown in Table 1 and Comparative Examples 1, 11, and 16, the results of hole position accuracy (average of mean (Ave.)+3σ) for holes of 1 to 1,500 hits, 1 to 3,000 hits, 1 to 4,500 hits, and 1 to 6,000 hits are shown in Table 2. Moreover, a graph obtained by plotting the results of these Examples and Comparative Examples as hole position accuracy against cumulative numbers of hole boring is shown in FIG. 7. Furthermore, graphs obtained by plotting all the results of hole position accuracy of Examples and Comparative Examples against the amounts of solid lubricants blended to compare are shown in FIG. 5 (in the case of an cumulative number of holes bored of 3000 hits) and in FIG. 6 (in the case of an cumulative number of holes bored of 6000 hits). In the figures, "□" represents a plot of Comparative Example in which the solid lubricant was not blended, "●" represents a plot of Examples 1 and 2, "○" represents a plot of Comparative Examples in which the solid lubricant 2 was used, "Δ" represents a plot of Comparative Examples in which the solid lubricant 3 was used, and "×" represents a plot of Comparative Examples in which the solid lubricant 4 was used.

TABLE 2

| | Solid lubricant | | | |
|---|---|---|---|---|
| Cumulative number of holes bored hits | Example 1 Molybdenum disulfide 80 parts by mass μm | Comparative Example 11 Zinc molybdate 40 parts by mass μm | Comparative Example 16 Molybdenum trioxide 10 parts by mass μm | Comparative Example 1 Solid lubricant not contained μm |
| 1500 | 14.8 | 20.1 | 20.8 | 27.9 |
| 3000 | 16.8 | 23.8 | 20.1 | 29.3 |
| 4500 | 18.5 | 22.4 | 25.8 | 32.0 |
| 6000 | 21.3 | 25.8 | 26.2 | 35.5 |

The composition (1) of the water-soluble resin (A) contained 30 parts by mass of a polyethylene oxide (manufactured by Meisei Chemical Works, Ltd., product name: ALTOP MG-150, Mw: 150,000) and 70 parts by mass of a polyethylene glycol (manufactured by Sanyo Chemical Industries, Ltd., product name: PEG 20000, Mw: 20,000), totaling 100 parts by mass.

The kind (2) of solid lubricant was molybdenum disulfide (manufactured by Daizo Corporation, product name: M-5 powder, range of particle diameter: 0.5 to 29 μm, average particle diameter: 5 μm, molybdenum disulfide purity: 98%, layered structure).

Figure 2:
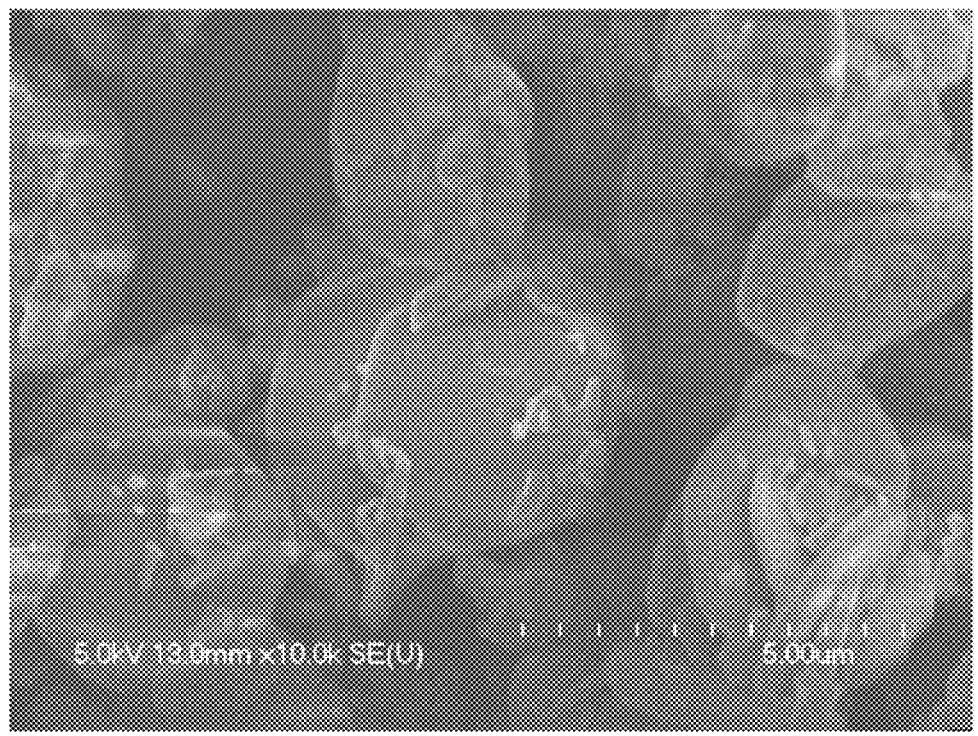
FIG. 2 is a scanning electron micrograph illustrating an example of zinc molybdate.

The kind (3) of solid lubricant was zinc molybdate (manufactured by Nippon Inorganic Colour & Chemical Co., Ltd., range of particle diameter: 0.4 μm to 13 μm, average particle diameter: 3 μm, layered structure. A scanning electron micrograph (magnifications: 10000) of a part of zinc molybdate is illustrated in FIG. 2.).

Figure 3:
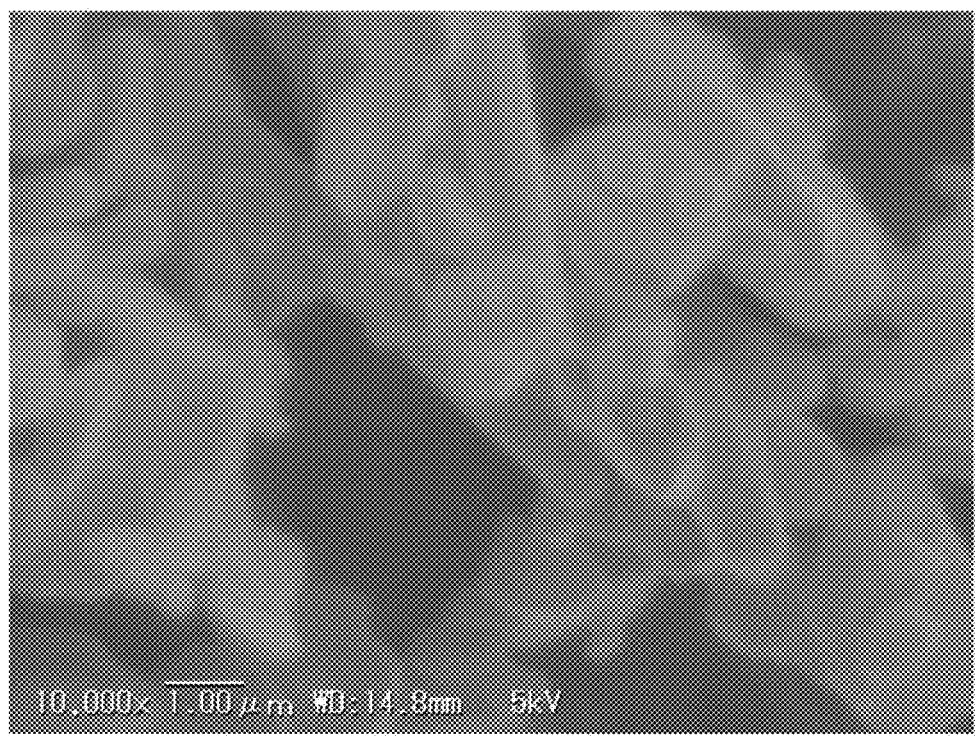
FIG. 3 is a scanning electron micrograph illustrating an example of molybdenum trioxide.

The kind (3) of solid lubricant was molybdenum trioxide (manufactured by Nippon Inorganic Colour & Chemical Co., Ltd range of particle diameter: 0.7 μm to 55 μm, average particle diameter: 16 μm, columnar structure. A scanning electron micrograph (magnifications: 10000) of a part of molybdenum trioxide is illustrated in FIG. 3.).

Moreover, an entry sheet in which a solid lubricant was not used was made as the kind (5).

The content of the solid lubricant based on 100 parts by mass of the resin contained in the resin composition was any of 0 parts by mass, 5 parts by mass, 10 parts by mass, 20 parts by mass, 40 parts by mass, 60 parts by mass, 80 parts by mass, 90 parts by mass, 100 parts by mass, and 200 parts by mass.

The hole boring processing condition (1) was that a drill bit (C-CFU020S manufactured by Tungaloy Corporation, drill bit diameter: 0.2 mmφ) was used, the number of rotations: 200,000 rpm, feeding speed: 13 μm/rev., and lifting speed: 25.4 m/min, and the object of hole boring in which 5 copper clad laminated boards (manufactured by Mitsubishi Gas Chemical Company, Inc., product name: CCL-HL832, thickness: 0.2 mm, copper foil thickness: 12 μm) were piled up was used.

As shown in the results of Table 1, the present inventors have found the critical region that realizes outstanding hole position accuracy by blending a large amount of molybdenum disulfide as a solid lubricant as large as 70 parts by mass to 130 parts by mass based on 100 parts by mass of the resin contained in the resin composition. Conventionally, efforts how to improve the hole position accuracy by 1 μm have been made, however the results of the present invention that brings about such an outstanding improvement in hole position accuracy cannot be anticipated even for a person skilled in the art. Moreover, as shown in the results of Table 2, it has been understood that molybdenum disulfide realizes outstandingly excellent hole position accuracy in any of the cumulative numbers of hole boring.

From the results shown in Table 1, it has been understood that the samples of Examples 1 and 2 are excellent in hole position accuracy in any of the stages where the wear of the drill bit is progressed and not progressed compared with the samples of Comparative Examples 1 to 22. Namely, it has been understood that molybdenum disulfide of the present invention is remarkably excellent in hole position accuracy by optimizing the amount of molybdenum disulfide blended compared with zinc molybdate and molybdenum trioxide that are solid lubricants which have conventionally been used.

In addition, the present application claims priority based on Japanese Patent Application (Japanese Patent Application No. 2012-071081) filed with Japan Patent Office on Mar. 27, 2012, the contents of which are hereby incorporated with reference.

According to the present invention, an entry sheet for drilling that is excellent in hole position accuracy and reduces breakage of a drill bit compared with the conventional entry sheet for drilling can be provided.

REFERENCE SIGNS LIST

A: Drill bit
B: Crystal of water-soluble resin (A)
C: Metallic support foil
D: Centripetal force
E: Molybdenum disulfide

The invention claimed is:

1. An entry sheet for drilling comprising:
a first side and a second side opposite of the first side wherein,
a metallic support foil as an outermost layer on the first side of the entry sheet; and
a layer comprising a resin composition as an outermost layer on the second side of the entry sheet,
wherein the resin composition comprises a water-soluble resin and 70 parts by mass to 130 parts by mass of molybdenum disulfide as a solid lubricant based on 100 parts by mass of the resin, the water-soluble resin selected from the group consisting of polyethylene oxide, polypropylene oxide, polyalkylene glycol, polyethylene glycol, polypropylene glycol, and combinations thereof, the molybdenum disulfide in the form of solid particles dispersed in the resin composition, and
the layer comprising the resin composition has a thickness in a range from 0.02 to 0.3 mm.

2. The entry sheet for drilling according to claim 1, wherein the molybdenum disulfide has an average particle diameter of 1 to 20 μm.

3. The entry sheet for drilling according to claim 1, wherein the molybdenum disulfide has a purity of 85 mass % or more.

4. The entry sheet for drilling according to claim 1, wherein the resin composition comprises a water-insoluble lubricant that is not a solid lubricant.

5. The entry sheet for drilling according to claim 4, wherein the water-insoluble lubricant that is not a solid lubricant comprises one or two or more compounds selected from the group consisting of amide compounds, aliphatic acid compounds, aliphatic acid ester compounds, aliphatic hydrocarbon compounds, and higher aliphatic alcohols.

6. The entry sheet for drilling according to claim 1, wherein the metallic support foil has a thickness in a range from 0.05 to 0.5 mm.

7. The entry sheet for drilling according to claim 1, further comprising a primer layer being a resin film between the metallic support foil and the layer comprising the resin composition, wherein the primer layer has a thickness in a range from 0.002 to 0.02 mm.

8. The entry sheet for drilling according to claim 7, wherein the primer layer comprises a solid lubricant comprising molybdenum disulfide.

9. The entry sheet for drilling according to claim 8, wherein the primer layer comprises 1 part by mass to 50 parts by mass of the molybdenum disulfide based on 100 parts by mass of a composition constituting the primer layer.

10. The entry sheet for drilling according to claim 7, wherein the resin contained in the primer layer contains one or two or more thermosetting resins selected from the group consisting of epoxy resins and cyanate resins.

11. The entry sheet for drilling according to claim 7, wherein the resin contained in the primer layer contains one or two or more thermoplastic resins selected from the group consisting of urethane polymers, vinyl acetate polymers, vinyl chloride polymers, polyester polymers, and acrylic polymers, and copolymers of these polymers.

12. The entry sheet for drilling according to claim 7, wherein the resin contained in the primer layer contains one or two or more adhesive resins selected from the group consisting of melamine resins, urea resins, phenol resins, chloroprene rubber, nitrile rubber, styrene butadiene rubber, and silicone rubber.

13. The entry sheet for drilling according to claim 1, wherein the layer comprising the resin composition is formed on at least one surface of the metallic support foil by a coating method, the layer comprising the resin composition is obtained by conducting coating on the at least one surface of the metallic support foil with a solution in which the resin composition is dissolved or dispersed in a mixed solvent of water and a solvent having a boiling point lower than the boiling point of water, and the solvent having a boiling point lower than the boiling point of water contains one or two or more solvents selected from the group consisting of alcohols, methyl ethyl ketone, acetone, tetrahydrofuran, and acetonitrile.

14. The entry sheet for drilling according to claim 13, wherein a blending ratio of the water to the solvent having a boiling point lower than the boiling point of water contained in the mixed solvent is in a range from 90/10 to 50/50 on a mass basis.

15. The entry sheet for drilling according to claim 1, the entry sheet to be used for hole boring processing with a drill bit having a diameter of 0.2 mm or less.

16. The entry sheet for drilling according to claim 1, the entry sheet to be used for drilling processing of a laminated board or a multi-layer board.

17. The entry sheet for drilling according to claim 1, the resin composition comprising 80 parts by mass to 130 parts by mass of molybdenum disulfide based on 100 parts by mass of the resin.

18. A method for drilling a printed wiring board material, comprising the steps of:
arranging the entry sheet of claim 1 on at least a surface of the printed wiring board material,
the entry sheet being arranged so that the metallic support foil side makes contact with the printed wiring board material; and
conducting a drilling process starting from a surface of the layer comprising the resin composition through the entry sheet.

* * * * *